United States Patent
Helberg et al.

(10) Patent No.: US 10,613,598 B2
(45) Date of Patent: Apr. 7, 2020

(54) EXTERNALLY MOUNTED COMPONENT COOLING SYSTEM

(71) Applicant: Dell Products L.P., Round Rock, TX (US)

(72) Inventors: Christopher Michael Helberg, Austin, TX (US); Cyril Adair Keilers, Georgetown, TX (US); Shawn Paul Hoss, Georgetown, TX (US)

(73) Assignee: Dell Products L.P., Round, TX (US)

( * ) Notice: Subject to any disclaimer, the term of this patent is extended or adjusted under 35 U.S.C. 154(b) by 29 days.

(21) Appl. No.: 16/010,013

(22) Filed: Jun. 15, 2018

(65) Prior Publication Data
US 2019/0387645 A1    Dec. 19, 2019

(51) Int. Cl.
*G06F 1/20* (2006.01)
*H05K 7/20* (2006.01)

(52) U.S. Cl.
CPC .......... *G06F 1/20* (2013.01); *H05K 7/20145* (2013.01)

(58) Field of Classification Search
CPC .. G02F 1/133385; G02F 2001/133628; H05K 7/20972; H05K 7/20727; H05K 7/20836; H05K 7/20136–20163; G06F 1/206; G06F 1/20
USPC .......... 361/679.46–679.54, 688–723
See application file for complete search history.

(56) References Cited

U.S. PATENT DOCUMENTS

| | | | | |
|---|---|---|---|---|
| 5,559,673 | A * | 9/1996 | Gagnon | G06F 1/20 165/122 |
| 7,471,511 | B2 * | 12/2008 | Montag | G06F 1/1601 348/730 |
| 10,108,221 | B1 * | 10/2018 | Gu | G06F 1/189 |
| 2002/0075642 | A1 * | 6/2002 | Nagashima | G02F 1/133385 361/679.52 |
| 2004/0230845 | A1 * | 11/2004 | Su | G06F 1/206 713/300 |
| 2005/0145404 | A1 * | 7/2005 | Yagi | G06F 1/20 174/17 VA |
| 2007/0084625 | A1 * | 4/2007 | Martin | H02G 3/04 174/135 |
| 2011/0290894 | A1 * | 12/2011 | Dufresne, II | G06F 1/20 236/49.3 |
| 2012/0010754 | A1 * | 1/2012 | Matteson | H05K 7/20836 700/282 |
| 2012/0325013 | A1 * | 12/2012 | Rubenstein | G06F 1/20 73/861.08 |
| 2013/0021747 | A1 * | 1/2013 | Guan | G06F 1/1601 361/679.47 |

(Continued)

*Primary Examiner* — Zachary Pape
(74) *Attorney, Agent, or Firm* — Haynes and Boone, LLP

(57) ABSTRACT

An externally mounted component cooling system includes a chassis defining a chassis housing and including an outer surface that is located opposite the chassis from the chassis housing. An air inlet is defined by the chassis and extends through the chassis from the outer surface to the chassis housing. At least one external component mounting feature is included on the outer surface of the chassis adjacent the air inlet. An external component is coupled to the at least one external component mounting feature. A forced convection device is located in the chassis housing and is configured to generate an airflow through chassis housing. The generation of the airflow by the forced convection device draws air past the external component and through the air inlet to cool the external component.

20 Claims, 14 Drawing Sheets

(56) References Cited

U.S. PATENT DOCUMENTS

| | | | | |
|---|---|---|---|---|
| 2014/0118937 A1* | 5/2014 | Adrian | ............... | H05K 7/20172 |
| | | | | 361/695 |
| 2015/0029032 A1* | 1/2015 | Lin | ........................ | G06F 1/206 |
| | | | | 340/584 |
| 2016/0299185 A1* | 10/2016 | Peng | ........................ | G06F 1/20 |
| 2017/0329364 A1* | 11/2017 | Kim | ........................ | G06F 1/16 |

\* cited by examiner

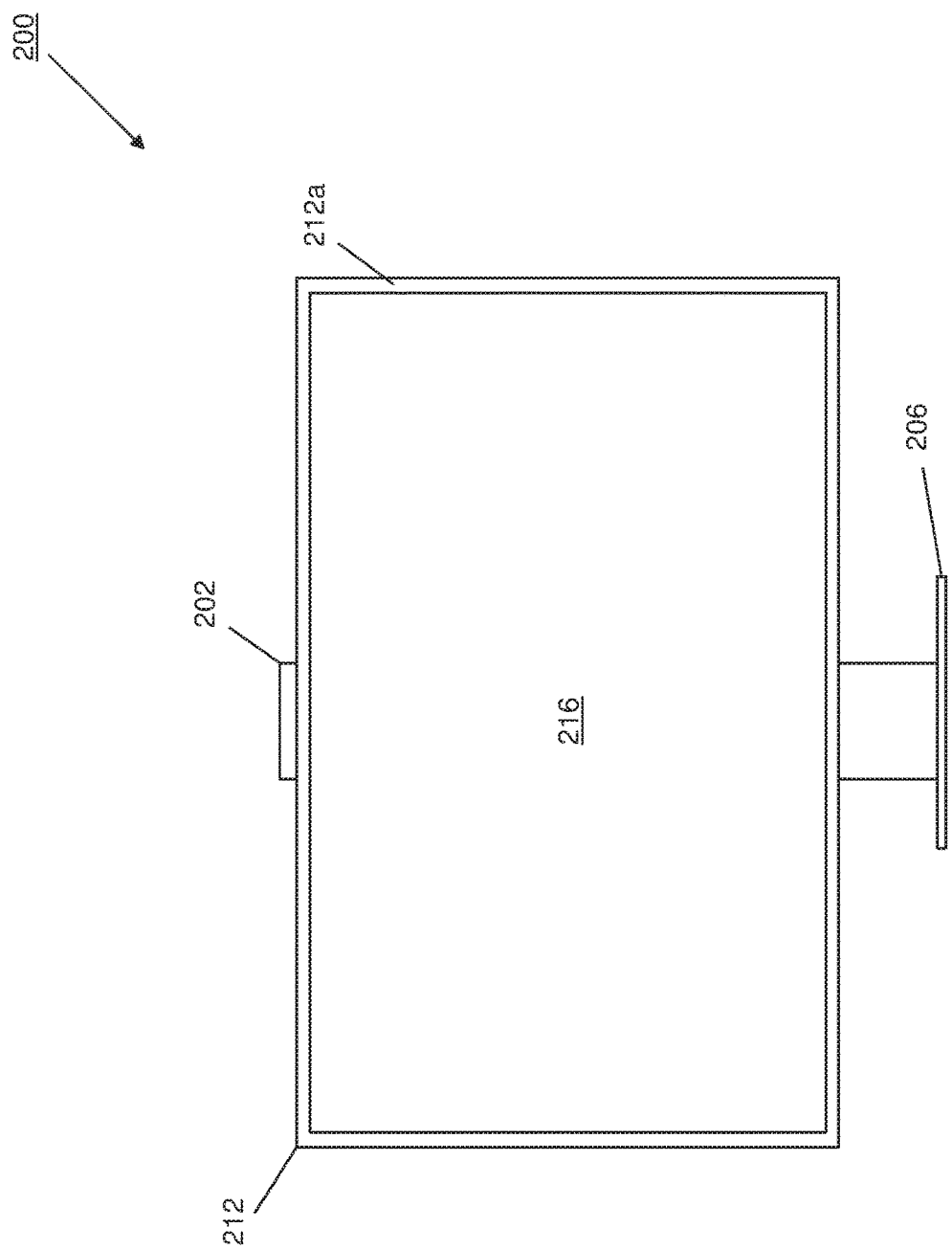

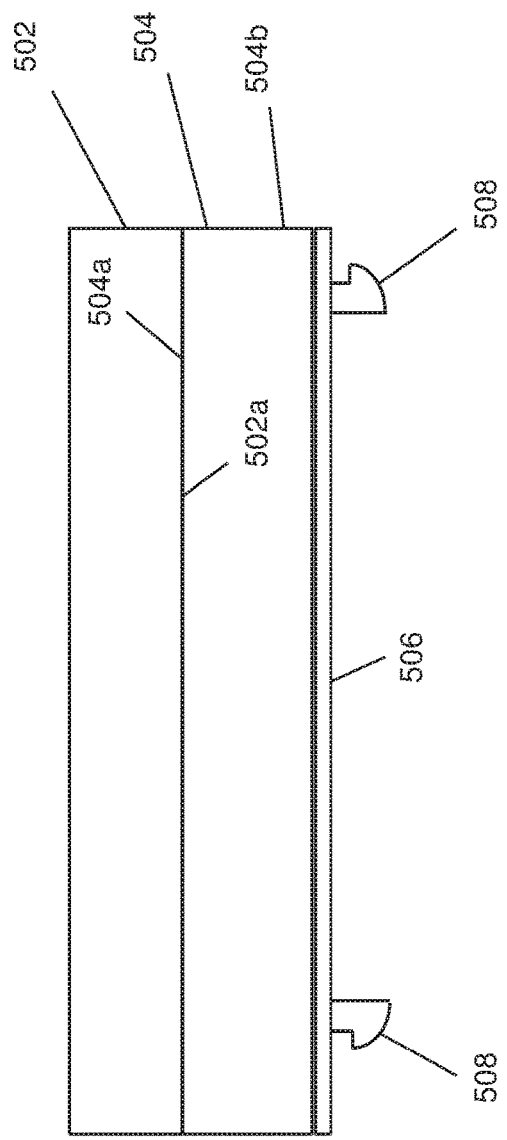

EXTERNALLY MOUNTED COMPONENT COOLING SYSTEM

BACKGROUND

The present disclosure relates generally to information handling systems, and more particularly to cooling a component that is externally mounted on a chassis of an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It has become desirable to reduce the size of information handling systems. For example, the reduction in size of many information handling components has allowed for corresponding reductions in the size of the chassis utilized with desktop computing devices, laptop/notebook computing devices, tablet computing devices, mobile phones, and other computing devices known in the art. However, in many situations it may be desirable to expand the functionality of such computing devices by adding components to the computing device, and the limited volume available in the chassis may prevent or hinder that expansion. A common solution to such issues is to provide desired components external to the chassis, but these and similar solutions experience issues when such external components require supplemental cooling, as the cooling systems for the computing device are provided internal to the chassis (i.e., in a chassis housing.) As such, a separate, external cooling system must be provided for those external components in order to allow them to operate at full capacity.

Accordingly, it would be desirable to provide an improved system for cooling external components.

SUMMARY

According to one embodiment, an Information Handling System (IHS) includes a chassis defining a chassis housing and including an outer surface that is located opposite the chassis from the chassis housing; an air inlet defined by the chassis and extending through the chassis from the outer surface to the chassis housing; at least one external component mounting feature included on the outer surface of the chassis adjacent the air inlet, wherein the at least one external component mounting feature is configured to couple to an external component; and a forced convection device located in the chassis housing and configured to generate an airflow through chassis housing, wherein the generation of the airflow by the forced convection device draws air past the external component and through the air inlet to cool the external component when the external component is coupled to the at least one external component mounting feature.

BRIEF DESCRIPTION OF THE DRAWINGS

FIG. 2B is a front view illustrating an embodiment of the computing system of FIG. 2A.

FIG. 5A is a side view illustrating an embodiment of an external component.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O)

devices, such as a keyboard, a mouse, touchscreen and/or a video display. The information handling system may also include one or more buses operable to transmit communications between the various hardware components.

Figure 1:
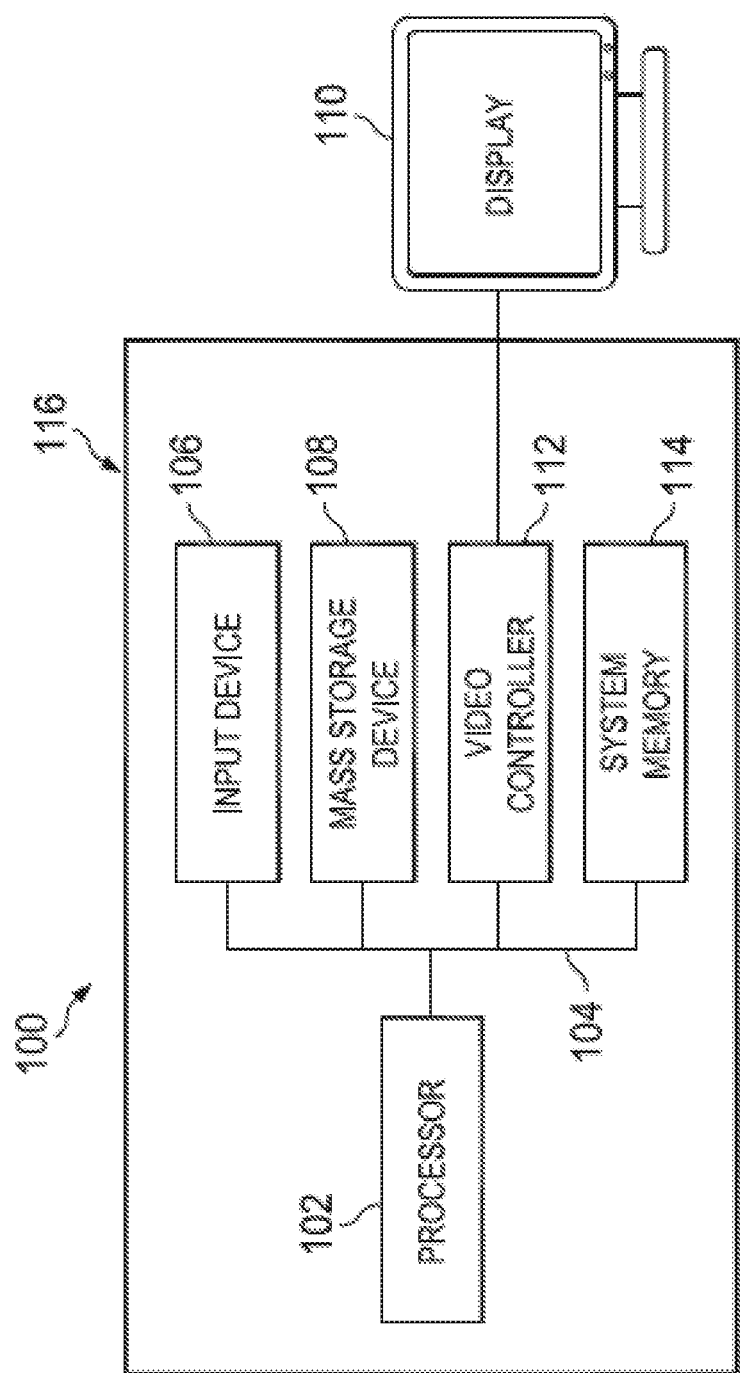
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
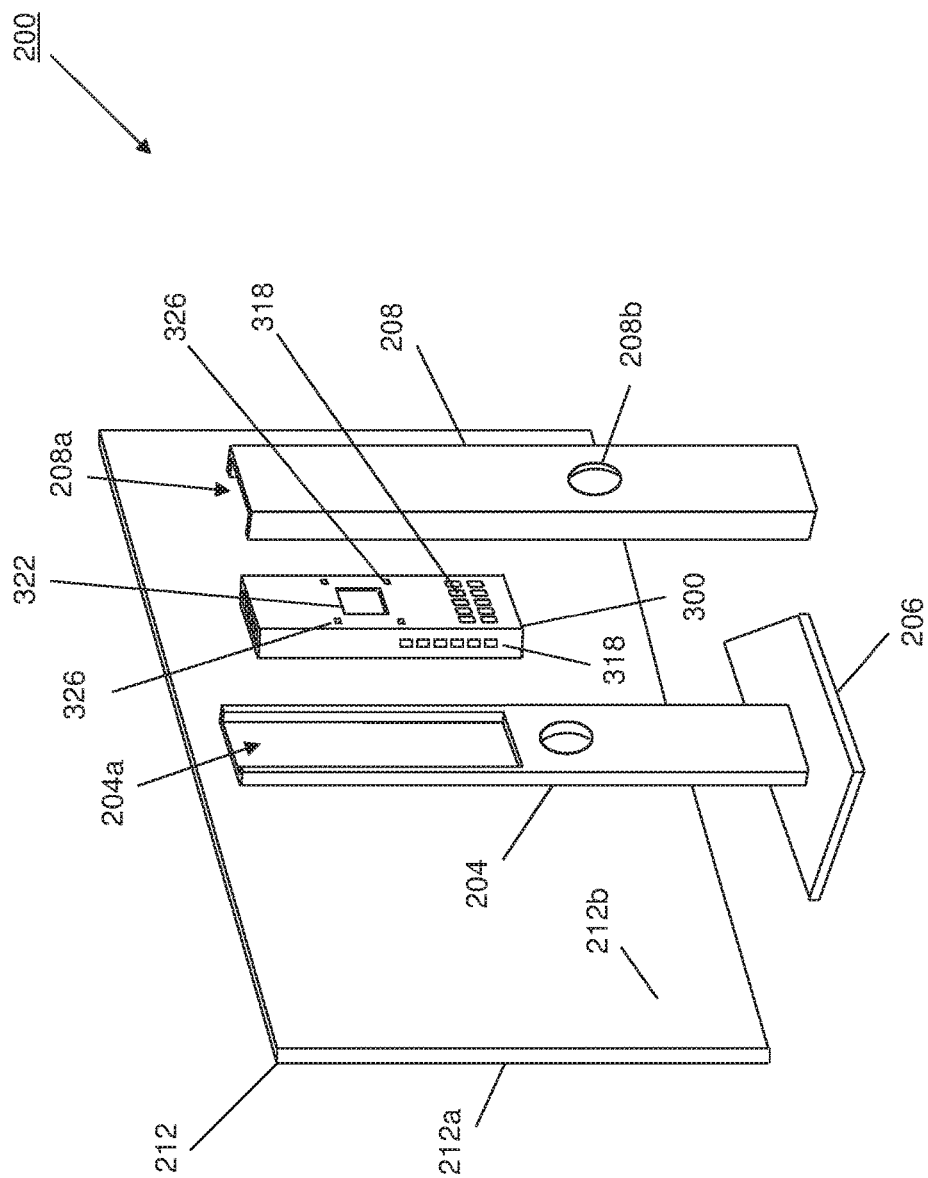
FIG. 2A is a rear perspective view illustrating an embodiment of a computing system.
Figure 2C:
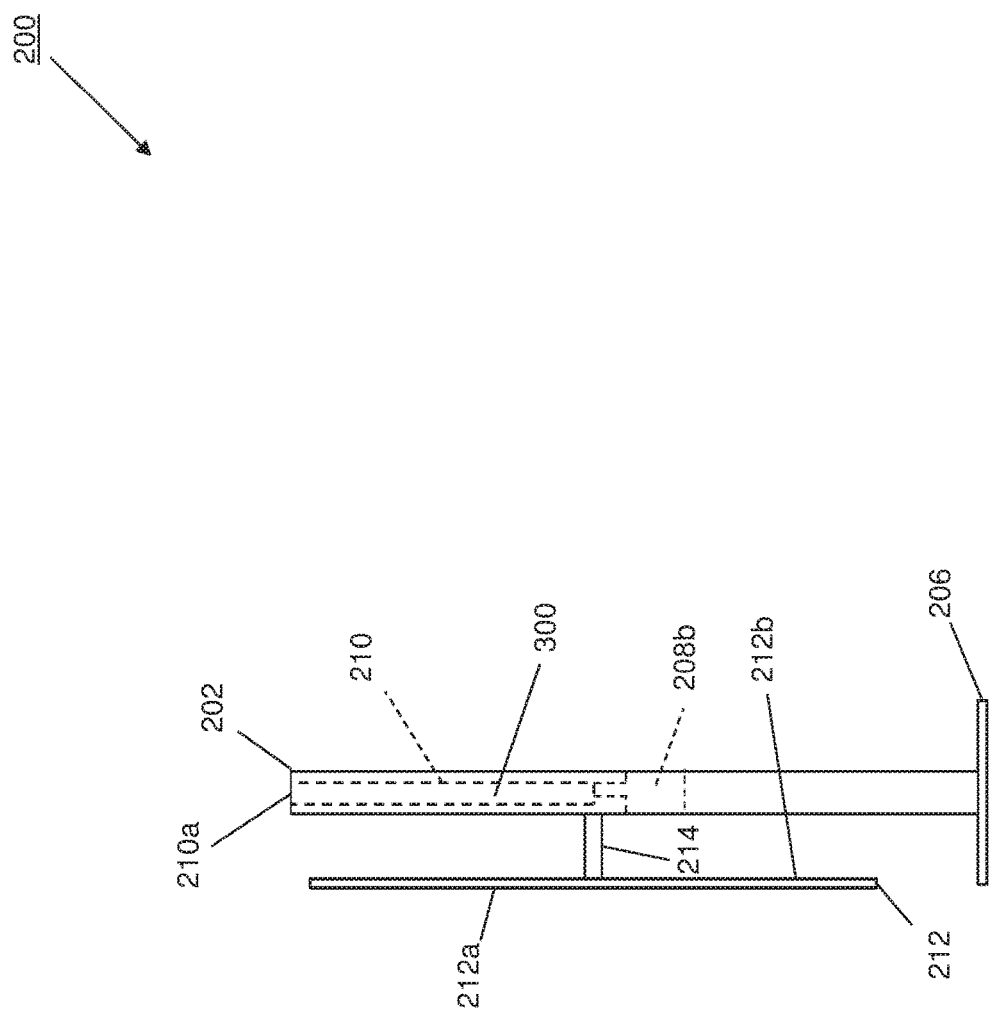
FIG. 2C is a side, partial cross-sectional view illustrating an embodiment of the computing system of FIGS. 2A and 2B.

Referring now to FIGS. 2A, 2B, and 2C, an embodiment of computing system 200 is illustrated. In an embodiment, the computing system 200 may be provided by the IHS 100 discussed above with reference to FIG. 1, and/or may include some or all of the components of the IHS 100. In the embodiments illustrated and described herein, the computing system 200 is provide by a computing module that provides the compute functionality (e.g., processing, storage, etc.) of the computing system 200, with that computing module housed in a display stand chassis that supports a display device. However, one of skill in the art in possession of the present disclosure will recognize that other computing systems such as, for example, server computing systems, desktop computing systems, laptop/notebook computing systems, and/or other computing systems known in the art may benefit from the teachings of the present disclosure and, as such, will fall within its scope as well. In the illustrated embodiment, the computing system 200 includes a display stand chassis 202 having a first display stand chassis portion 204 that is mounted to a display stand base 206 and that defines a first display stand chassis housing portion 204a, and a second display stand chassis portion 208 that defines a second display stand chassis housing portion 208a. As discussed below, the second display stand chassis portion 208 is configured to couple to the first display stand chassis portion 204 such that the first display stand chassis housing portion 204a and the second display stand chassis housing portion 208a define a display stand chassis housing 210. As illustrated, the second display stand chassis portion 208 may also define a display stand chassis housing air inlet 208b that, as discussed below, allows for air to be drawn into the display stand chassis housing, and may also provide for the routing of cables through the display stand chassis 202 (e.g., cables which may be connected to the components of the computing system 200.)

A display device 212 is coupled to the display stand chassis 202 by at least one support member 214. The display device 212 has a first side 212a that includes a display screen 216, and a second side 212b that is located opposite the display device 212 from the first side 212a (e.g., providing a rear surface of the display device 212.) A computing module 300 is configured to be positioned in the display stand chassis housing 210 (i.e., when the second display stand chassis housing portion 208a is coupled to the first display stand chassis portion 204), and is discussed in further detail below with reference to FIGS. 3A, 3B, and 3C. While not3, one of skill in the art in possession of the present disclosure will recognize that the display stand chassis 202 may include a variety of mounting structures, securing elements, connections (e.g., display connections, power connections, etc.), and/or any other coupling features that enable the computing module 300 to be coupled to the display stand chassis 202, as well enable the components in the computing module 300 to be coupled to the display device 212, a power source, and/or other computing system elements (e.g., peripheral devices) while remaining within the scope of the present disclosure. While a specific computing system has been described, one of skill in the art in possession of the present disclosure will recognize that computing systems may include other components and/or component configurations while remaining within the scope of the present disclosure as well.

Figure 3A:
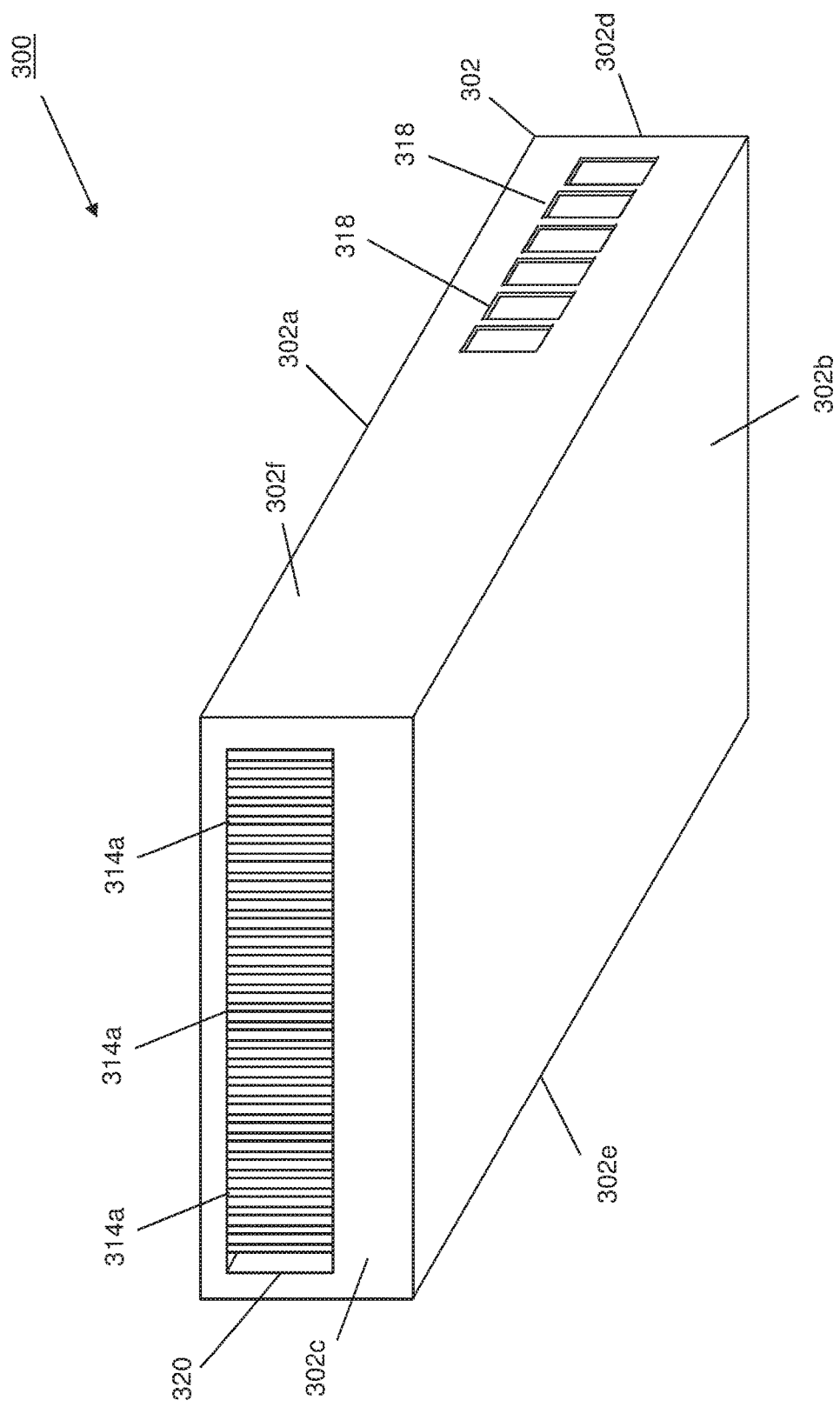
FIG. 3A is a bottom perspective view illustrating an embodiment of a computing module that may be used with the computing system of FIGS. 2A-C.
Figure 3B:
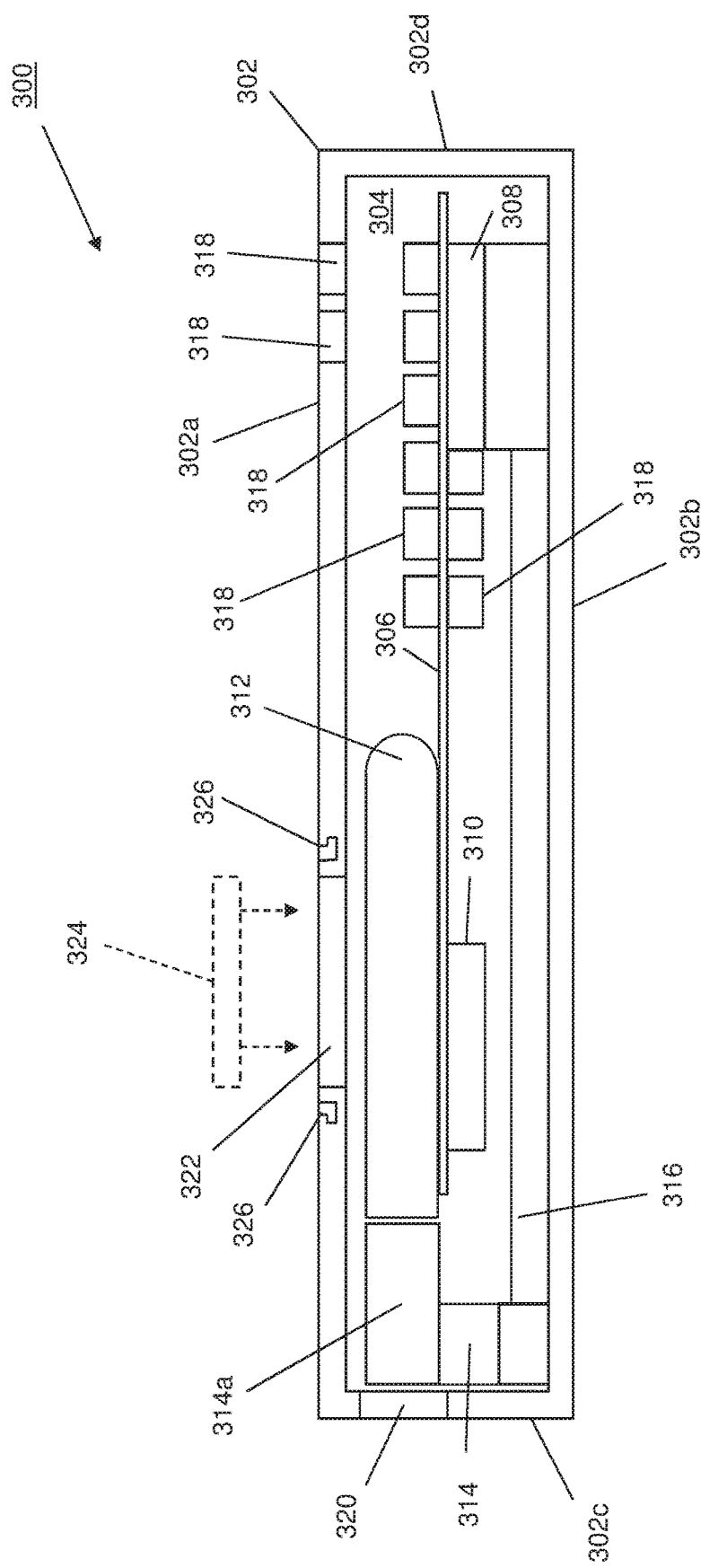
FIG. 3B is a side cross-sectional view illustrating an embodiment of the computing module of FIG. 3A.
Figure 3C:
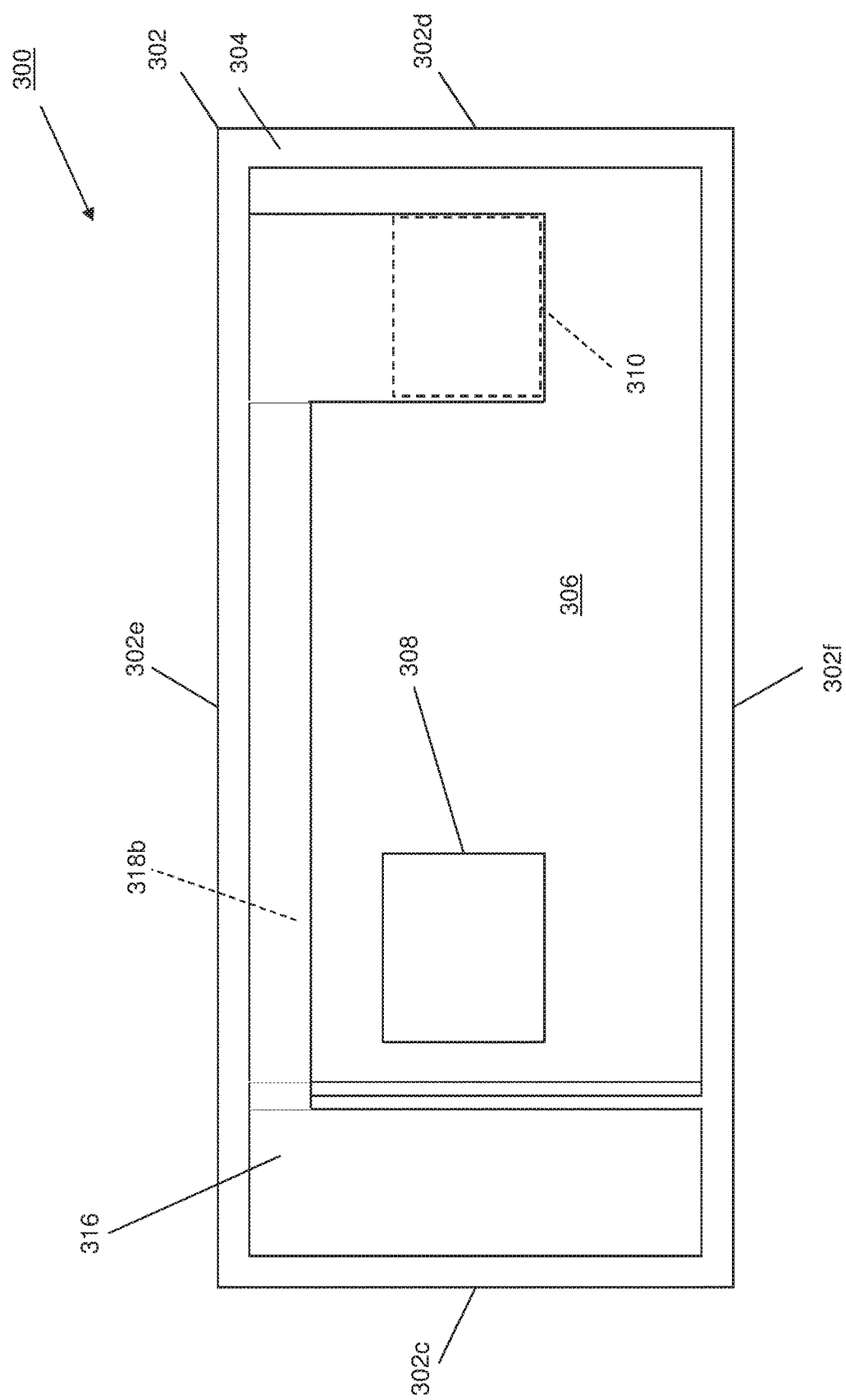
FIG. 3C is a bottom cross-sectional view illustrating an embodiment of the computing module of FIGS. 3A and 3B.

Referring now to FIGS. 3A, 3B, and 3C, an embodiment of a computing module 300 is illustrated. In an embodiment, the computing module 300 may be the IHS 100 of FIG. 1, and/or may include some or all of the components of the IHS 100. While the computing module 300 is illustrated and described herein as being housed in a display stand chassis and coupled to a display device on that display stand chassis, the teaching of the present disclosure may be beneficial to a variety of devices and/or systems that can benefit from the cooling described herein, and thus those devices and systems are envisioned as falling within the scope of the present disclosure as well. In the illustrated embodiment, the computing module 300 includes a computing chassis 302 that may house components (e.g., of the IHS 100), only some of which are illustrated in FIGS. 3A-C. The computing chassis 302 includes a computing chassis top outer surface 302a, a computing chassis bottom outer surface 302b that is located opposite the computing chassis 302 from the computing chassis top outer surface 302a, a computing chassis front outer surface 302c that extends between the computing chassis top outer surface 302a and the computing chassis bottom outer surface 302b, a computing chassis rear outer surface 302d that is located opposite the computing chassis 302 from the computing chassis front outer surface 302c and that extends between the computing chassis top outer surface 302a and the computing chassis bottom outer surface 302b, and a pair of opposing computing chassis side outer surfaces 302e and 302f that are located opposite the computing chassis 302 from each other and that extend between the computing chassis top outer surface 302a, the computing chassis bottom outer surface 302b, the computing chassis front outer surface 302c, and the computing chassis rear outer surface 302d.

As illustrated in FIGS. 3B and 3C, the computing chassis 302 defines a computing chassis housing 304 between the computing chassis top outer surface 302a, the computing chassis bottom outer surface 302b, the computing chassis front outer surface 302c, the computing chassis rear outer surface 302d, and the computing chassis side outer surfaces 302e and 302f, and that computing chassis housing 304 may be utilized to house components (e.g., of the IHS 100). As can be seen in FIGS. 3B and 3C, the components housed in the computing chassis housing 304 may include a board 306 (e.g., a motherboard) to which a first heat producing component 308 and a second heat producing component 310 are mounted. In some embodiments, the first heat producing component 308 and/or the second heat producing component 310 may be provided by, for example, a processing system (e.g., a Central Processing Unit (CPU)), a memory system (e.g., Dynamic Random Access Memory (DRAM) devices), and/or a variety of other computing devices that would be apparent to one of skill in the art in possession of the present disclosure. In a specific example, the heat producing components may includes a processing system that is coupled to a memory system through the board 306, with the memory system including instructions that, when executed by the processing system, cause the processing system to provide a cooling engine that is configured to perform the functionality of the cooling engines and computing modules discussed below. Furthermore, heat producing components in the computing chassis housing 304 (or external to the computing chassis housing 304) may include storage devices having databases that store any of the information utilized (e.g., by the cooling engine) as discussed below. However, in other embodiments, the first and second heat producing components may be provided by any heat producing devices that would be apparent to one of skill in the art in possession of the present disclosure.

In the illustrated embodiment, a forced convection device 312 is located on the board 306 and in the computing chassis housing 304 between the board 306 and the computing chassis wall of the computing chassis 302 that includes the computing chassis top outer surface 302a. The forced convection device 312 may be provided by a fan, a blower, and/or other forced convection cooling devices that would be apparent to one of skill in the art in possession of the present disclosure. A heat dissipation structure 314 is located in the computing chassis housing 304 adjacent the forced convection device 312, and in the illustrated embodiment includes a plurality of spaced apart heat dissipation fins 314a that define a plurality of airflow channels (i.e., between the heat dissipation fins 314a) extending from the forced convection device 312. A heat transfer device 316 (e.g., a heat pipe, a vapor chamber, or other heat transfer subsystem that would be apparent to one of skill in the art in possession of the present disclosure) is located in the computing chassis housing 304, engages the heat dissipation structure 314, extends through the computing chassis housing 304 (e.g., while engaging the computing chassis wall that includes the bottom outer surface 302b of the computing chassis 302 in the illustrated embodiment), and engages the first heat producing component 308.

While not illustrated, one of skill in the art in possession of the present disclosure will recognize that thermal substrates (e.g., heat transfer pastes) may be provided between the heat transfer device 316 and the heat dissipation structure 314, between the heat transfer device 316 and the first heat producing component 308 (e.g., the engagement of the evaporator side of the heat pipe and a Central Processing Unit (CPU)), and/or to enhance the engagement of any heat transfer subsystems in the computing chassis 302. Furthermore, while the heat transfer device 316 is described as a heat pipe, in other embodiments, the heat transfer device 316 may be integrated, embedded, or otherwise engaged with the computing chassis wall that includes the bottom outer surface 302b of the computing chassis 302 in a variety of manners that will fall within the scope of the present disclosure as well.

In the illustrated embodiment, a plurality of computing chassis housing air inlets 318 are defined by the computing chassis walls of the computing chassis 302 that include the computing chassis top outer surface 302a and the computing chassis side outer surfaces 302e and 302f. As discussed below, the computing chassis housing air inlets 318 are configured to allow air to be drawn from outside the computing chassis 302 and into the computing chassis housing 304 to the forced convection device 312 (e.g., for use in generating the airflows discussed below.) Furthermore, a computing chassis heat dissipation aperture 320 is defined by the wall of the computing chassis 302 that includes the computing chassis front outer surface 302c of the computing chassis 302, and is located immediately adjacent the heat dissipation fins 314a and opposite the heat dissipation fins 314a from the forced convection device 312. As discussed below, the forced convection device 312 is configured to produce an airflow that is directed through the channels defined by the heat dissipation fins 314a, and out the computing chassis heat dissipation aperture 320.

In the illustrated embodiment, an external component cooling air inlet 322 is defined by the computing chassis wall of the computing chassis 302 that include the computing chassis top outer surface 302a, with the external component cooling air inlet 322 located adjacent the forced convection device 312 (e.g., above the forced convection device 312 in the illustrated embodiment.) As illustrated by dashed lines in FIG. 3B, an air inlet blocking element 324 may be positioned in the external component cooling air inlet 322 (e.g., using coupling features on the chassis 302, not illustrated) in order to prevent air from being drawn into the chassis housing 304 via the external component cooling air inlet 322 (e.g., when no external component is coupled to the chassis 302, discussed in further detail below.) While illustrated as an element that may be manually positioned in the external component cooling air inlet 322 to block airflow through the external component cooling air inlet 322, the air inlet blocking element 324 may be provided by more complicated mechanical/and electrical subsystems that allow for automatic blocking and unblocking of the external component cooling air inlet 322 in response to the detection of an external component (e.g., by the cooling engine), as discussed in further detail below. Furthermore, while specific air inlets and outlets have been illustrated and described, one of skill in the art in possession of the present disclosure will recognize that air inlets and outlets for the computing module 300 may be located in a variety of locations that will fall within the scope of the present disclosure.

A plurality of external component mounting features 326 are included on the chassis 302 adjacent the external component cooling air inlet 322. While illustrated and described as coupling holes that are defined by the computing chassis 302, one of skill in the art in possession of the present disclosure will recognize that the external component mounting features 326 may be provided by a variety of coupling and/or securing mechanisms while remaining within the scope of the present disclosure. As illustrated in FIGS. 2A and 2B, the computing module 300 may be positioned in the display stand chassis housing 210 of the display stand chassis 202. However, while a specific computing module has been described, computing modules may include different components and/or configurations that will fall within the scope of the present disclosure as well.

Figure 4:
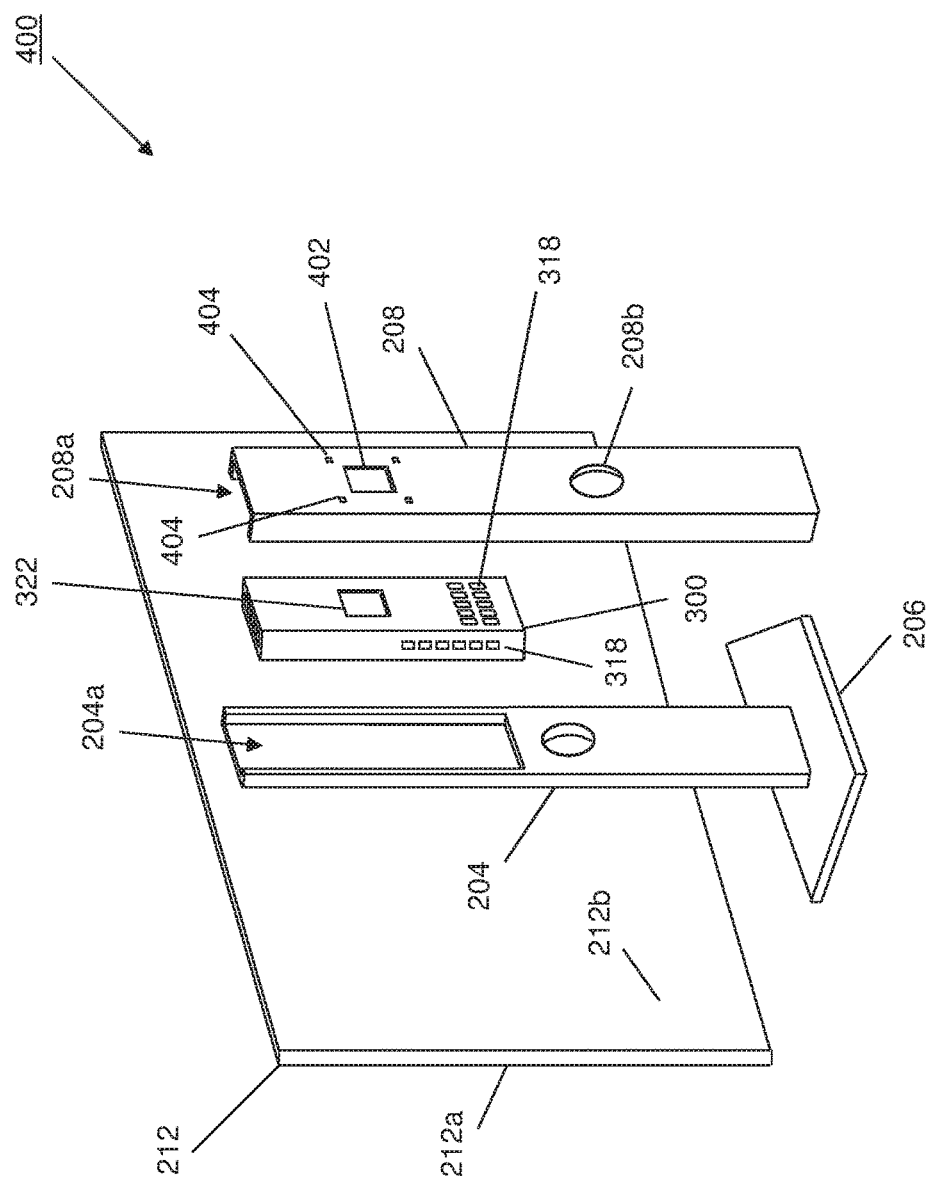
FIG. 4 is a rear perspective view illustrating an embodiment of a computing system.

Referring now to FIG. 4, an alternative embodiment of a computing system 400 is illustrated that is substantially similar to the computing systems 200 discussed above with reference to FIGS. 2A, 2B, and 2C and, as such, similar elements are provided the same numbers in each of the embodiments. As can be seen in FIG. 4, the computing system 400 differs from the computing system 200 due to the second display stand chassis portion 208 defining an external component cooling air inlet 402, and due to external component mounting features 404 provided on the second display stand chassis portion 208 adjacent the external component cooling air inlet 402 (e.g., in place of the external component mounting features 326 on the computing device 200.) As can be seen in FIG. 4, when the computing module 300 is positioned in the display stand chassis housing 210 of the display stand chassis 202, the external component cooling air inlet 322 on the computing module 300 may align with the external component cooling air inlet 402 on the second display stand chassis portion 208 to provide an air inlet to the chassis housing 304 from outside of the display stand chassis 202. While not illustrated, an air inlet blocking element (similar to the air inlet blocking element 324 illustrated and discussed above) may be positioned in the external component cooling air inlet 402 in order to prevent air from being drawn into the chassis housing 304 via the external component cooling air inlets 322/402 when no external component is coupled to the display stand chassis 202, discussed in further detail below. While not explicitly described below, one of skill in the art in possession of the present disclosure will recognize that the computing system 200 provides for the mounting of external components directly to the computing module 300, while the computing system 400 provides for the mounting of external components directly to the display stand chassis 202, with both embodiments providing for the externally mounted component cooling of the present disclosure.

Figure 5B:
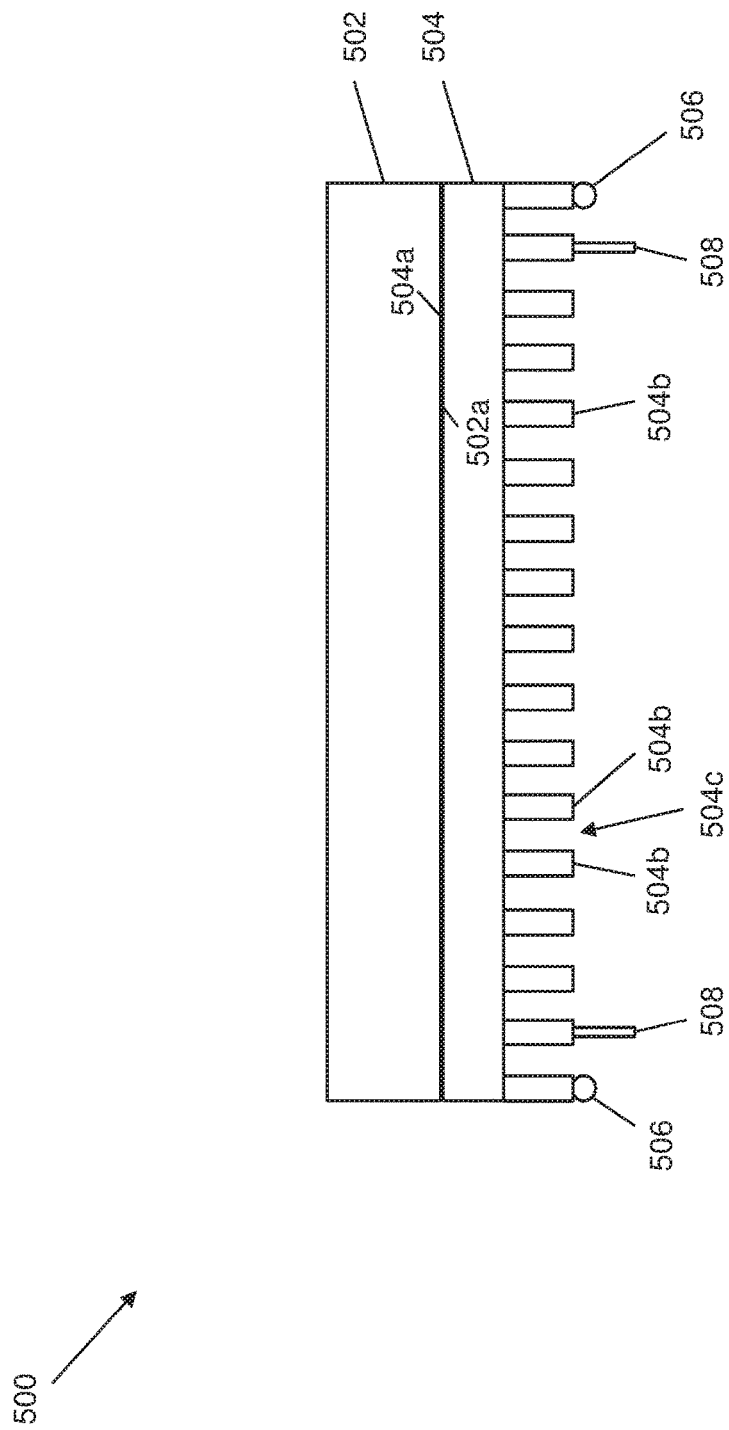
FIG. 5B is a front view illustrating an embodiment of the external component of FIG. 5A.

Referring now to FIGS. 5A and 5B, an embodiment of an external component 500 is illustrated. In the illustrated embodiment, the external component 500 includes a heat producing device 502 having an engagement surface 502a. For example, the heat producing device 502 may include a hard drive, a battery, a networking subsystem, a graphics processing system, and/or a variety of other heat producing devices that would be apparent to one of skill in the art in possession of the present disclosure. The external component 500 also includes a heat dissipation device 504 having an engagement surface 504a that engages the engagement surface 502a on the heat producing device 502. While not illustrated, one of skill in the art in possession of the present disclosure will recognize that a substrate such as a thermal paste may be provided between the engagement surfaces 502a and 504a on the heat producing device 502 and heat dissipation device 504, respectively, in order to enhance heat transfer from the heat producing device 502 to the heat dissipation device 504. In the specific example illustrated in FIGS. 5A and 5B, the heat dissipation device 504 is provided by a heat sink, and includes a plurality of fin elements 504b that extend from the heat dissipation device 504 in a spaced apart orientation from each other to define a plurality of airflow channels 504c between them. Furthermore, in the illustrated embodiment, seals 506 such as, for example, gasket members, are provided on at least some of the fin elements 504b (e.g., on the "outer" fin elements that extend along a portion of the perimeter edge of the heat dissipation device 504 in the illustrated embodiment.) Finally, a plurality of coupling members 508 extend from the heat dissipation device 504 (e.g., some of the fin elements 504b), and may be provided by any features that are configured to provide the coupling/securing functionality described below. While a specific external component has been described, one of skill in the art in possession of the present disclosure will recognize that external components may include a variety of features and/or configurations that allow for the functionality described below while remaining within the scope of the present disclosure.

Figure 6:
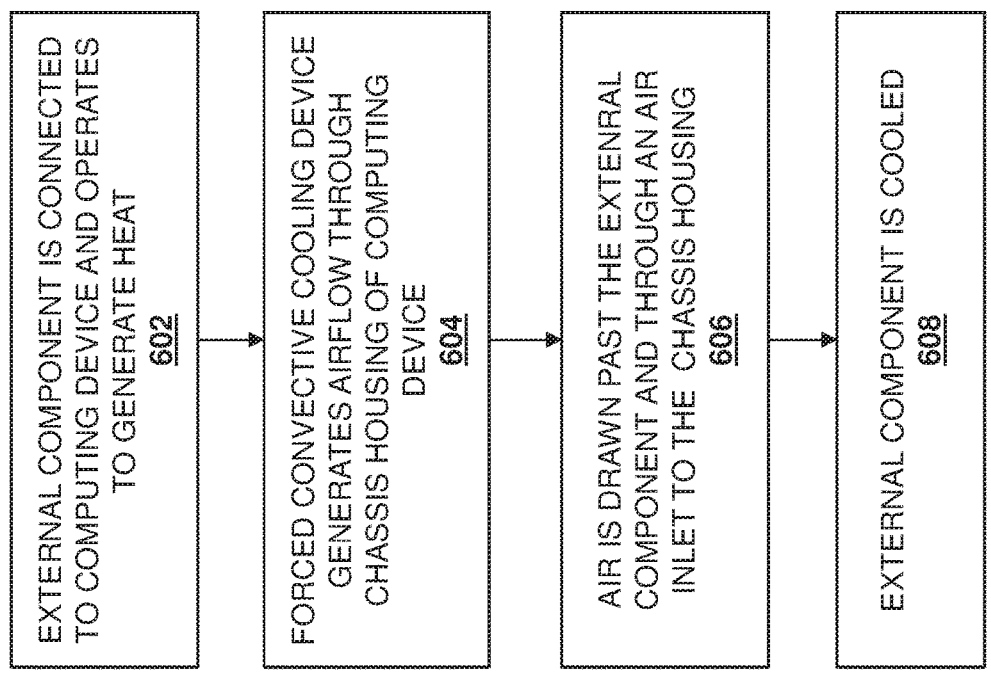
FIG. 6 is a flow chart illustrating an embodiment of a method for cooling an external component.
Figure 6:
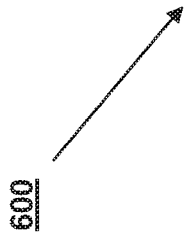

Referring now to FIG. 6, an embodiment of a method 600 for cooling an external component is illustrated. As discussed below, the systems and methods of the present disclosure provide for the cooling of an externally mounted component that is utilized by a computing system via a forced convection device that is located internally in that computing system. For example, the forced convection device may be provided in a chassis housing defined by a chassis of the computing system, and an external component cooling air inlet may be defined by that chassis immediately adjacent the location on the chassis to which the external component is mounted (e.g., via mounting features included on the outer surface of the chassis.) When the forced convection device is operated to produce an airflow, that causes air to be drawn in through the external component cooling air inlet, and that air moves past the external component to dissipate heat generated by that external component. In order to enhance the cooling of external components cooled in such a manner, the external component may include a heat dissipation device (e.g., a heat sink) that engages the outer surface of the chassis to couple, secure, and seal to the outer surface of the chassis in such a manner that directs air that is drawn in through the external component cooling air inlet past heat dissipation members (e.g., through channels defined between heat dissipation fins) on the heat dissipation device. As such, external components may be utilized by computing systems to increase the functionality of the computing system, while also ensuring cooling of those external components using cooling devices that are internal to those computing systems.

Figure 7A:
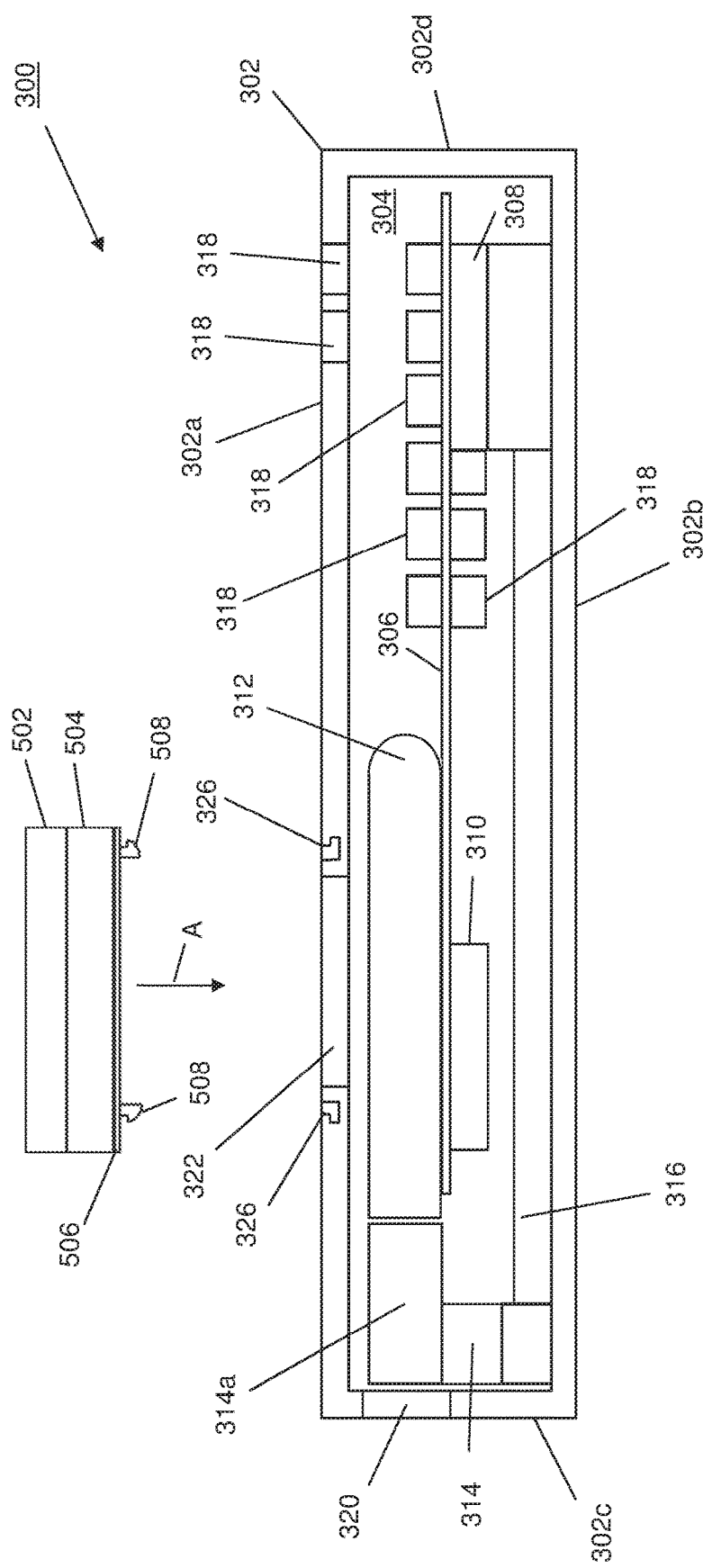
FIG. 7A is a partial cross-section view illustrating an embodiment of the external component of FIGS. 5A and 5B being coupled to the computing module of FIGS. 2A-C.
Figure 7B:
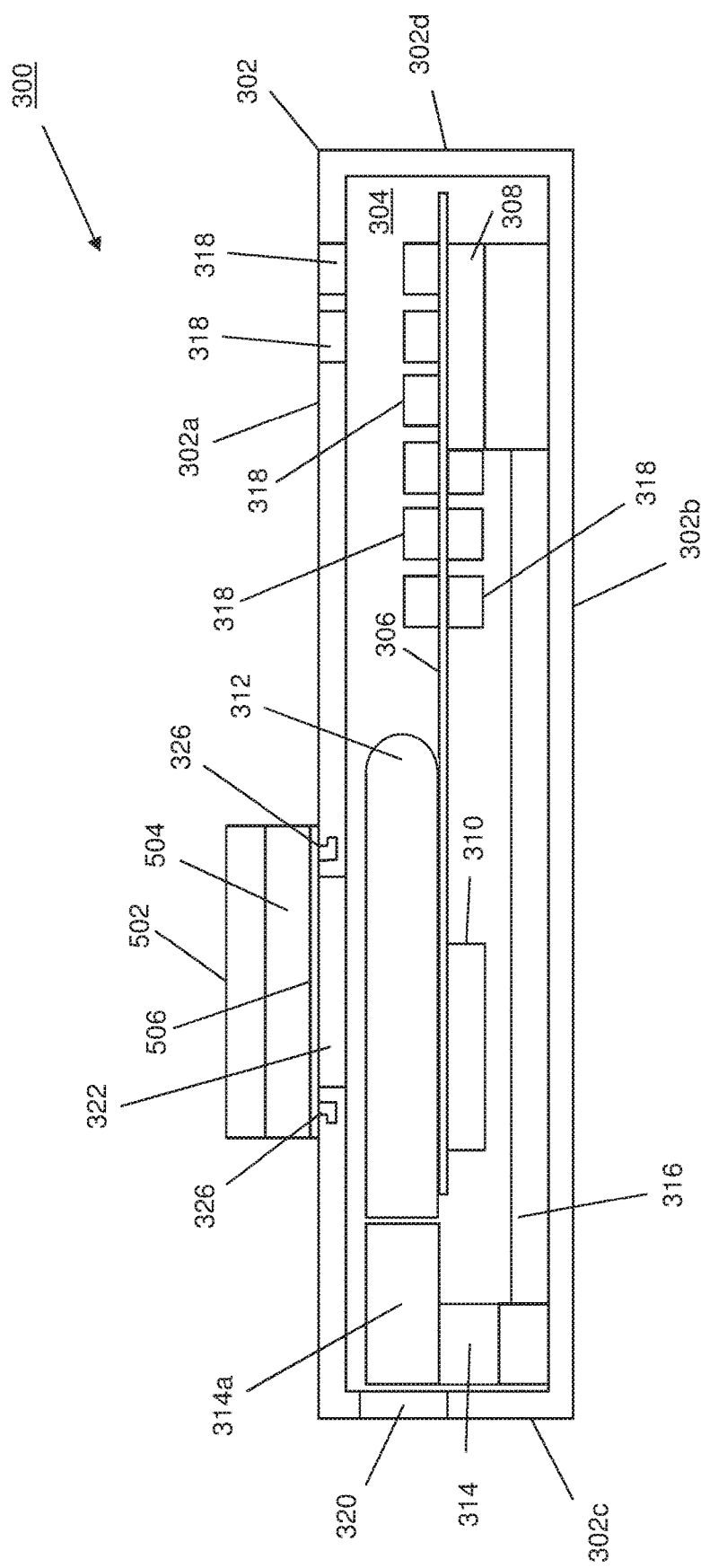
FIG. 7B is a partial cross-section view illustrating an embodiment of the external component of FIGS. 5A and 5B coupled to the computing module of FIGS. 2A-C.

The method 600 begins at block 602 where an external component is connected to a computing device and operates to generate heat. In an embodiment, at block 602, the external component 500 of FIGS. 5A and 5B may be connected to the computing module 300 of FIGS. 3A-3C. For example, with reference to FIGS. 7A and 7B, the external component 500 may be positioned adjacent the computing module 300 such that the heat dissipation device 504 is located adjacent the computing chassis top outer surface 302a of the computing chassis 302, with respective coupling members 508 on the heat dissipation device 504 aligned with corresponding external component mounting features 326 on the chassis 302, as illustrated in FIG. 7A. The external component 500 may then be moved in a direction A towards the computing chassis 302 such that the respective coupling members 508 on the heat dissipation device 504 directly engage with corresponding external component mounting features 326 on the chassis 302 to couple and secure the external component 500 to the computing chassis 302, as illustrated in FIG. 7B. In the illustrated embodiment, the coupling and securing of the external component 500 to the computing chassis 302 provides for the engagement of the seals/gasket members 506 on the heat dissipation device 504 with the computing chassis top outer surface 302a. While the seals/gaskets 506 are illustrated as located on the "outer" fin elements of the heat dissipation device 504 that extend along a portion of the perimeter edge of the heat dissipation device 504 in the illustrated embodiment, the seals/gasket elements 506 may include a variety of configurations, and in some examples those configurations may correspond to the configuration of the external component cooling air inlet 322 in order to, for example, provides for the channeling and/or directing of air past the heat dissipation device 504 and into the computing chassis housing 304 in a manner that optimizes heat dissipation.

While not illustrated, the connecting of the external component 500 to the computing module 300 may include electrically connecting the external component 500 to the computing module 300 to provide data and/or power couplings between the external component 500 and the computing module 300, and/or to the external component 500. For example, in some embodiments the connection of the coupling members 508 on the heat dissipation device 504 with corresponding external component mounting features 326 on the chassis 302 may provide for the connections of power connectors, data connectors, and/or other electrical couplings that would be apparent to one of skill in the art in possession of the present disclosure as providing for the power, data, and/or other couplings that enable the external component 500 to be used with the computing module 300. In another example, cabling between connectors on the computing module 300 and the external component 500 (not illustrated) may provide for the connections of power connectors, data connectors, and/or other electrical couplings that would be apparent to one of skill in the art in possession of the present disclosure as providing for the power, data, and/or other couplings that enable the external component 500 to be used with the computing module 300. With the electrical connection of the external component 500 and the computing module 300, the external component 500 may receive power and may be controlled by the computing module 300 (e.g., by a processing system in the computing module 300) in order to operate and generate heat. For example, the external component 500 may generate heat due to graphics processing operations, storage operations, networking operations, battery operations, and/or a variety of other external component operations that would be apparent to one of skill in the art in possession of the present disclosure.

In some embodiments, the air inlet blocking element 324 illustrated in FIG. 3B may be manually removed (e.g., by a user) from the external component cooling air inlet 322 before the external component 500 is connected to the computing module 300 as discussed above. However, in other embodiments, the connection of the external component 500 to the computing module 300 may be detected (e.g., by the cooling engine discussed above), and may result in the air inlet blocking element 324 being automatically removed (e.g., mechanically/electrically actuated) from the external component cooling air inlet 322 (e.g., such that it is located in the computing chassis housing 304, or a recess defined in the computing chassis wall that includes the computing chassis top outer surface 302a.) While a few examples have been discussed, one of skill in the art in possession of the present disclosure will recognize that a variety of mechanisms may be utilized to block airflow through the external component cooling air inlet 322 when the external component 500 is not utilized with the computing module 300 while remaining within the scope of the present disclosure. Furthermore, in some embodiments, the external component cooling air inlet 322 may not be blocked (i.e., air may be allowed to flow through the external component cooling air inlet 322) even when no external component 500 is utilized with the computing module 300.

In some embodiments, the computing module 300 may be configured to modify the operation of the forced convection device 312 in response to the connection of the external component 500 to the computing module 300. For example, the cooling engine provided by the components in the computing module 300 (discussed above) may detect that the external component 500 is coupled to the external component mounting features 326 and, in response, may modify the operation of the forced convection device 312. The detection of the external component 500 by the cooling engine may occur as a result of the mechanical connection of the external component 500 with the external component mounting features 326 (e.g., via a mechanical switch), as a result of the electrical connection of the external component 500 with the external component mounting features 326 (e.g., via a data communication or power communication over those electrical connection(s)), and or via other detection methods that would be apparent to one of skill in the art in possession of the present disclosure.

In a specific embodiment, the detection of the external component 500 by the cooling engine may be accomplished via cooling profile(s) stored in a database provided by a storage device utilized with the computing module 300. For example, prior to the method 600, the operation of the computing module 300 with and without the external component 500 may be characterized, and cooling profile(s) resulting from those characterization may then be stored in the database/storage device. As such, following the connection of the external component 500 to the computing module 300, the cooling engine may monitor one or more cooling factors associated with the operation of the forced convection device 312 (e.g., airflow rates, chassis housing temperature(s), heat producing component temperatures, etc.), and compare those cooling factor(s) to the cooling profile(s) stored in the database/storage device. One of skill in the art in possession of the present disclosure will recognize how the cooling factors associated with the operation of the forced convection device will change depending on whether the external component 500 is coupled to the computing module 300, and thus the monitoring of those cooling factors will allow the cooling engine to detect when the external component 500 is coupled to the external component mounting features 326 and, in response, modify the operation of the forced convection device 312. One of skill in the art in possession of the present disclosure will also recognize that the modification of the operation of the forced convection device 312 may include increasing the operation of the forced convection device 312 (e.g., increasing a fan speed or blower operation) when the external component 500 is coupled to the computing module 300 in order to produced a desired airflow past the external component 500 and through the external component cooling air inlet 322, discussed in further detail below.

Figure 7C:
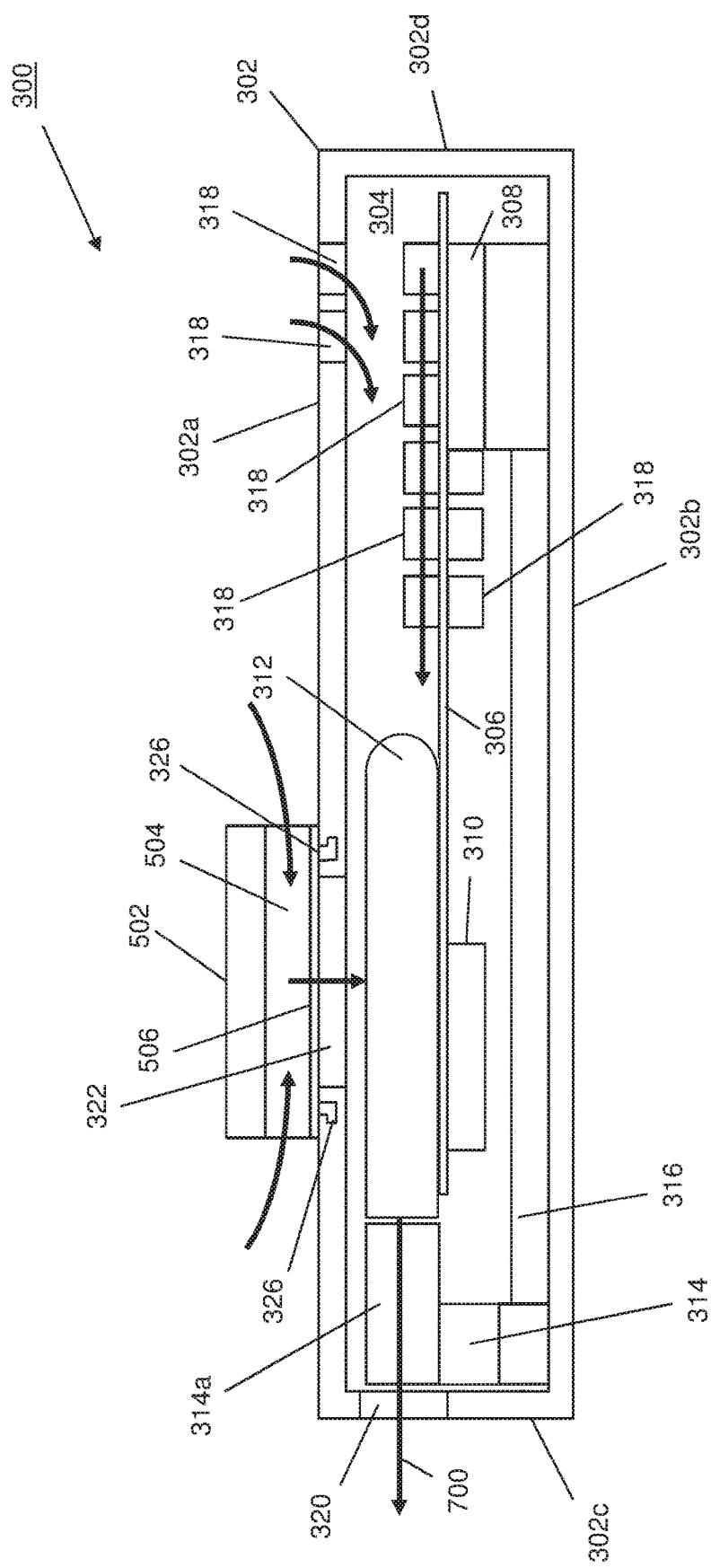
FIG. 7C is a partial cross-section view illustrating an embodiment of the external component of FIGS. 5A and 5B being cooled by the computing module of FIGS. 2A-C.

While not illustrated or described in detail herein, at block 602, the external component 500 may be coupled to the display stand chassis 202 of FIG. 4 in substantially the same manner as described above for coupling the external component 500 to the computing module 300. One of skill in the art in possession of the present disclosure will appreciate how the coupling of the external component 500 to the display stand chassis 202 may include the electrical coupling of the external component 500 and the computing module 300 discussed above, the manipulation of the air inlet blocking element (when present on the computing system 400), the operation of the external component 500, and/or any of the other functionality described herein. As such, following block 602, in some embodiments the computing module 300 may include the external component 500 mounted on its computing chassis top outer surface 302 as illustrated in FIGS. 7A-C, and both may be positioned in the display stand chassis housing 210 (i.e., when the second display stand chassis housing portion 208a is coupled to the first display stand chassis portion 204.) In other embodiments, following block 602, the computing module 300 may be positioned in the display stand chassis housing 210 (i.e., when the second display stand chassis housing portion 208a is coupled to the first display stand chassis portion 204), and the external component 500 may be mounted to the display stand chassis 202 (e.g., via the external component mounting features 404 and adjacent the external component cooling air inlet 402).

The method 600 then proceeds to block 604 where a forced convection cooling device generates an airflow through a chassis housing of the computing device. With reference to FIG. 7C, in an embodiment of block 604, the forced convection device 312 may be operated to generate an airflow 700 through the computing chassis housing 304 of the computing module 300. As can be seen from FIG. 7C, the operation of the forced convection device 312 draws air from outside the computing chassis 302, and into the computing chassis housing 304 through the computing chassis housing air inlets 318 defined by the computing chassis walls of the computing chassis 302 that include the computing chassis top outer surface 302a and the computing chassis side outer surfaces 302e and 302f. That air is then utilized by the forced convection device 312 to create the airflow 700 that is directed through the heat dissipation fins 314a on the heat dissipation structure 314, and out of the computing chassis heat dissipation aperture 320.

The method 600 then proceeds to block 606 where air is drawn past the external component and through an air inlet to the chassis housing. With reference to FIG. 7C, in an embodiment of block 606, the operation of the forced convection device 312 to generate the airflow 700 also draws air from outside the computing chassis 302, through the airflow channels 504c defined between the fin elements 504b of the heat dissipation device 504, and into the computing chassis housing 304 through the external component cooling air inlet 322 defined by the computing chassis wall of the computing chassis 302 that includes the computing chassis top outer surface 302a. That air is then utilized by the forced convection device 312 to create the airflow 700 that is directed through the heat dissipation fins 314a on the heat dissipation structure 314, and out of the computing chassis heat dissipation aperture 320. The method 600 then proceeds to block 608 where the external component is cooled. As will be appreciated by one of skill in the art in possession of the present disclosure, at block 608, the drawing of air through the airflow channels 504c defined between the fin elements 504b of the heat dissipation device 504 and into the computing chassis housing 304 through the external component cooling air inlet 322 operates to dissipate heat that is generated by the external component 500 and transferred to the heat dissipation device 504. As such, the operation of the forced convection device 312 that is internal to the computing chassis 302 (i.e., in the computing chassis housing 304) operates to cool the external component 500 that is mounted to the outer surface of the computing chassis 302.

Thus, systems and methods have been described that provide for the cooling of an externally mounted component that is utilized by a computing system via a forced convection device that is located internally in that computing system. The forced convection device is provided in a housing of the computing system, and an external component cooling air inlet is defined immediately adjacent the outer surface location to which the external component is mounted to the computing system. When the forced convection device is operated to produce an airflow, that causes air to be drawn in through the external component cooling air inlet, and that air moves past the external component to dissipate heat generated by that external component. In order to enhance the cooling of external components cooled in such a manner, the external component may include a heat sink that engages the outer surface of the computing system to couple, secure, and seal to the outer surface of the chassis in such a manner that directs air that is drawn in through the external component cooling air inlet through channels defined between heat dissipation fins on the heat sink. As such, external components may be utilized by computing systems to increase the functionality of the computing system, while also ensuring cooling of those external components using cooling devices that are internal to those computing systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An externally mounted component cooling system, comprising:
    a chassis defining a chassis housing and including an outer surface that is located opposite the chassis from the chassis housing;
    an air inlet defined by the chassis and extending through the chassis from the outer surface to the chassis housing;
    at least one external component mounting feature included on the outer surface of the chassis adjacent the air inlet;
    an external component that includes a heat producing device stacked upon a heat dissipation device, coupled to the at least one external component mounting feature; and
    a forced convection device located in the chassis housing and configured to generate an airflow through chassis housing, wherein the generation of the airflow by the forced convection device draws air past the external component and through the air inlet to cool the external component.

2. The system of claim 1, further comprising:
    an air outlet defined by the chassis and extending through the chassis from the outer surface to the chassis housing, wherein the forced convection device is configured to generate the airflow through chassis housing and out of the air outlet.

3. The system of claim 1, further comprising:
    at least one gasket member that is coupled to the external component and configured to direct air past the external component and through the air inlet.

4. The system of claim 1, further comprising:
    wherein the heat dissipation device is configured to directly engage the at least one external component mounting feature to couple the external component to the at least one external component mounting feature.

5. The system of claim 4, further comprising:
    a seal that is located between at least a portion of the heat dissipation device and the outer surface of the chassis.

6. The system of claim 1, further comprising:
a cooling engine included in the chassis, wherein the cooling engine is configured to:
   detect that the external component is coupled to the at least one external component mounting feature and, in response, modify the operation of the forced convection device.

7. An Information Handling System (IHS), comprising:
a chassis defining a chassis housing and including an outer surface that is located opposite the chassis from the chassis housing;
an air inlet defined by the chassis and extending through the chassis from the outer surface to the chassis housing;
at least one external component mounting feature that is included on the outer surface of the chassis adjacent the air inlet, wherein the at least one external component mounting feature is configured to couple to an external component; and
a forced convection device that is located in the chassis housing and that is configured to generate an airflow through the chassis housing, wherein the generation of the airflow by the forced convection device draws air past the external component and through the air inlet to cool the external component when the external component is coupled to the at least one external component mounting feature, the external component includes a heat producing device stacked upon a heat dissipation device.

8. The IHS of claim 7, further comprising:
an air outlet defined by the chassis and extending through the chassis from the outer surface to the chassis housing, wherein the forced convection device is configured to generate the airflow through chassis housing and out of the air outlet.

9. The IHS of claim 7, further comprising:
at least one gasket member that is coupled to the outer surface of the chassis, wherein the at least one gasket member is configured to direct air past the external component and through the air inlet when the external component is coupled to the at least one external component mounting feature.

10. The HIS of claim 7, wherein the at least one external component mounting feature is configured to directly engage the heat dissipation device that is mounted to the heat producing device in order to couple the external component to the at least one external component mounting feature.

11. The IHS of claim 10, further comprising:
a seal that is located on the outer surface of the chassis, wherein the seal is configured to be located between at least a portion of the heat dissipation device and the outer surface of the chassis when the heat dissipation device directly engages the at least one external component mounting feature.

12. The IHS of claim 7, further comprising:
a processing system that is located in the chassis housing; and
a memory system that is located in the chassis housing, coupled to the processing system, and that includes instructions that, when executed by the processing system, cause the processing system to provide a cooling engine that is configured to:
   detect that the external component is coupled to the at least one external component mounting feature and, in response, modify the operation of the forced convection device.

13. The IHS of claim 12, wherein the detecting that the external component is coupled to the at least one external component mounting feature includes:
   monitoring a plurality of cooling factors associated with the operation of the forced convection device;
   comparing the plurality of cooling factors to at least one cooling profile; and
   detecting that the external component is coupled to the at least one external component mounting feature based on the comparing of the plurality of cooling factors and the at least one cooling profile.

14. A method for cooling an external component, comprising: generating, by a forced convection device that is located in a chassis housing defined by a chassis that includes an outer surface opposite the chassis from the chassis housing, an airflow through the chassis housing; drawing, in response to the generation of the airflow, air past an external component that is coupled to at least one external component mounting feature included on the outer surface of the chassis, and through an air inlet that is defined by the chassis adjacent the at least one external component mounting feature and that extends through the chassis to the chassis housing; and cooling, via the air drawn past the external component and through the air inlet, the external component, wherein the external component includes a heat producing device stacked upon a heat dissipation device.

15. The method of claim 14, wherein the airflow generated by the forced convection device is directed out of an air outlet that is defined by the chassis and that extends through the chassis from the outer surface to the chassis housing.

16. The method of claim 14, further comprising:
directing, by at least one gasket member that engages the outer surface of the chassis, the air past the external component and through the air inlet.

17. The method of claim 14, wherein the at least one external component mounting feature directly engages the heat dissipation device that is mounted to the heat dissipation device in order to couple the external component to the at least one external component mounting feature.

18. The method of claim 17, further comprising:
providing a seal between the outer surface of the chassis and at least a portion of the heat dissipation device when the heat dissipation device directly engages the at least one external component mounting feature.

19. The method of claim 14, further comprising:
detecting, by a cooling engine that is located in the chassis housing, that the external component is coupled to the at least one external component mounting feature and, in response, modifying the operation of the forced convection device.

20. The method of claim 19, wherein the detecting that the external component is coupled to the at least one external component mounting feature includes:
   monitoring a plurality of cooling factors associated with the operation of the forced convection device;
   comparing the plurality of cooling factors to at least one cooling profile; and
   detecting that the external component is coupled to the at least one external component mounting feature based on the comparing of the plurality of cooling factors and the at least one cooling profile.

* * * * *